United States Patent [19]

Pasiecznik, Jr.

[11] Patent Number: 5,623,214
[45] Date of Patent: Apr. 22, 1997

[54] MULTIPORT MEMBRANE PROBE FOR FULL-WAFER TESTING

[75] Inventor: John Pasiecznik, Jr., Malibu, Calif.

[73] Assignee: Hughes Aircraft Company

[21] Appl. No.: 708,360

[22] Filed: Sep. 4, 1996

Related U.S. Application Data

[63] Continuation of Ser. No. 323,290, Oct. 14, 1994, abandoned.

[51] Int. Cl.$^6$ .................................................. G01R 31/02
[52] U.S. Cl. .......................... 324/754; 324/758; 324/757
[58] Field of Search ..................................... 324/754, 757, 324/758

[56] References Cited

U.S. PATENT DOCUMENTS

| | | |
|---|---|---|
| 4,161,692 | 7/1979 | Tarzwell . |
| 4,518,914 | 5/1985 | Okubo et al. . |
| 4,649,339 | 3/1987 | Gangroth et al. . |
| 4,697,143 | 9/1987 | Lockwood et al. . |
| 4,721,198 | 1/1988 | Yajima . |
| 4,733,172 | 3/1988 | Smolley . |
| 4,783,625 | 11/1988 | Harry et al. . |
| 4,786,867 | 11/1988 | Yamatsu . |
| 4,791,363 | 12/1988 | Logan . |
| 4,820,976 | 4/1989 | Brown . |
| 4,849,689 | 7/1989 | Gleason et al. . |
| 4,922,192 | 5/1990 | Gross et al. . |
| 4,928,061 | 5/1990 | Dampier et al. . |
| 4,943,767 | 7/1990 | Yokota . |
| 4,950,982 | 8/1990 | Obikane et al. . |
| 4,972,143 | 11/1990 | Kamensky et al. . |
| 5,012,187 | 4/1991 | Littlebury ........................ 324/72.5 |
| 5,027,063 | 6/1991 | Letourneau . |
| 5,034,685 | 7/1991 | Leedy . |
| 5,090,118 | 2/1992 | Kwon et al. . |
| 5,148,103 | 9/1992 | Pasiecznik, Jr. .................. 324/758 |
| 5,313,157 | 5/1994 | Pasiecznik, Jr. . |

FOREIGN PATENT DOCUMENTS

| | | |
|---|---|---|
| 0230348 | 7/1987 | European Pat. Off. . |
| 0259163 | 3/1988 | European Pat. Off. . |
| 0294939 | 12/1988 | European Pat. Off. . |
| 0304868 | 3/1989 | European Pat. Off. . |
| 62-169341 | 7/1987 | Japan . |
| 62-263647 | 11/1987 | Japan . |
| WO89/11659 | 11/1989 | WIPO . |

OTHER PUBLICATIONS

Patent Abstracts of Japan, vol. 12, No. 9 (E-572) 12 Jan. 1988, & JP-A-62169341 (Tokyo Electron) 25.7.87, Abstract Only.

1989 Proceedings 39th Electronic Components Conference, May 1989, pp. 71-77, Houston, US; J.A. Fulton et al., "Electrical and Mechanical Properties of a Metal-Filled Polymer Composite for Interconnection and Testing Applications".

*Primary Examiner*—Kenneth A. Wieder
*Assistant Examiner*—Russell M. Kobert
*Attorney, Agent, or Firm*—V. D. Duraiswamy; W. K. Denson-Low

[57] ABSTRACT

A membrane probe (10) for simultaneously testing two or more columns or rows of integrated circuits (37) while still on the wafer (56) upon which they are manufactured includes a flexible visually clear and self planarizing membrane (18) having circuit traces (22). A substrate (12) on which the membrane (18) is mounted features parallel ports (14) corresponding to alternate columns or rows of circuit chips (37) on the wafer to be tested. Two such substrates (12,112) thus forming two alternately used probe test heads (10,110) are employed for testing each full wafer, one test head (10) containing ports (14) corresponding to one set of alternate wafer columns or rows, the other test head (110) containing ports (114) corresponding to the remaining interlaced wafer columns or rows. Probe contact pads (30) are electroplated on areas of the traces (22) so that the contact pads (30) are visually registrable through the substrate ports. The probe test heads (10,110) have a configuration, dimension and structure like that of the wafer (56) itself so that automated pick and place equipment employed for handling the wafers (56) may also be used to handle the probe test heads (10,110). A unique pair of test fixture inserts (34,134) is adapted to receive and detachably secure a selected probe test head (11,110) to the its corresponding test fixture insert.

20 Claims, 5 Drawing Sheets

MULTIPORT MEMBRANE PROBE FOR FULL-WAFER TESTING

This is a continuation of application Ser. No. 08/323,290, filed Oct. 14, 1994, now abandoned.

BACKGROUND OF THE INVENTION

1. Field of the Invention

The present invention relates to testing of integrated circuits and more particularly concerns improved membrane probes.

2. Description of Related Art

Integrated circuits or chips including conductive traces, electrical components, and active devices are fabricated in batches of large numbers of similar or identical circuits on a single wafer and then individually cut from the wafer for use. Because production techniques and processes are pushed to the limits of accuracy and repeatability, significant numbers of circuits fabricated on a single wafer may prove to be unacceptable or inoperable. Therefore, before each circuit is separated from the others by severing the wafer into its many component circuits for its intended use, it is desirable to test each circuit individually.

Probe cards presently employed for testing of integrated circuits while still on the wafer employ a number of probe contact elements, commonly in the form of very small blades or needles that are mechanically and electrically fixed to a circuit board or the like and have leads that fan out to outer edges of the probe card for making connections between the probe card and testing circuitry. The contact blades or needles of the probe card are moved into contact with specific areas, namely the pads of the integrated circuit or chip under test, and may be electrically connected so as to apply selected input signals and to read output signals from the device under test. In this manner the chips are tested on the wafer, before being connected for intended use, by applying operating signals and monitoring and evaluating resultant outputs.

In the use of such probe cards, the contact between the probe card blades or needles and the circuit chip is frequently made by a scrubbing action, which tends to deflect the slender probe elements as much as several mils on each touchdown. This displacement, which occurs repetitively upon each test, further tends to change the desired positioning of the elements.

The probe may have from fifty to several hundred contacts, each of which must be precisely and individually positioned with respect to all others so that upon contact with the circuit chip all probe contacts will contact all pads of the chip under test. All of this means that the probe cards presently used are exceedingly expensive, require much maintenance, and are subject to many errors.

As integrated circuit speeds increase, so too do the difficulty and extent of the testing problems. Such problems are caused by cross-talk between adjacent signal traces, signal loss and degradation due to capacitive loading of the circuit under test, and increased need for shielding and impedance matching of signal lines throughout the test fixture and test head. High frequency probe transmission lines must be properly terminated. Although high frequency hardware can be provided up to the test head itself, the physical connection between the test head and the integrated circuit pad, which relies upon exposed metallic blades or needles, provides poor high frequency performance and extremely fragile components. Thus the final part of the probe transmission line cannot be properly terminated.

As size and spacing of integrated circuit chips decrease and density of chip contacts increases, it becomes ever more difficult to make mechanical blade or needle contacts as small and closely spaced as required for proper testing of modern integrated circuit chips. Moreover, the great bulk and complex configuration of prior art probe cards do not readily lend themselves to automated handling or simplified storage.

My U.S. Pat. No. 5,148,103 describing apparatus for testing integrated circuits has a number of features including employing a flexible diaphragm, conductive contact pads and an arrangement for applying pressure to one side of the flexible diaphragm to accomplish self planarizing contact of the probe pads against the pads of a die or chip under test. U.S. Pat. No. 5,148,103 also provides probe arrangements that adapt the probe for use in wafer testing processes using conventional pick and place loading and cassette storage of both membrane probes and test wafers.

However, neither the U.S. Pat. No. 5,148,103 nor any other known arrangement provides for economically fast full-wafer testing at high temperatures nor for a number of improvements that are available with the methods and apparatus described herein. Membranes of the prior art have a single port, which is not suitable for full wafer burn-in testing, i.e., simultaneous testing of all or substantial numbers of the hundreds of chips on a three, six or eight inch diameter wafer, because the deflection, or sag, of a large single membrane is too severe for chips, and even contacts, widely separated on the wafer. Although numerous attempts have been made by others to avoid excessive sag in the testing for individual chips (see, e.g., U.S. Pat. No. 5,264,787 to Woith et al., assigned to the assignee of the present application), no suitable solution to the problem of simultaneous testing of plural chips has been known heretofore.

Additionally, the diaphanous nature of the membrane in a single large aperture probe precludes mounting of the heavier circuit elements such as decoupling capacitors and isolating resistors within that central aperture, at points close to the test contacts.

Accordingly, it is an object of the present invention to provide for multi-chip testing of integrated circuit chips while avoiding or minimizing the problems mentioned above.

SUMMARY OF THE INVENTION

In carrying out principles of the present invention in accordance with an exemplary embodiment of one feature thereof, a plurality of columns or rows of integrated circuit chips formed on a single wafer are simultaneously tested by providing a test probe set. A test probe set consists of two or more test heads. In a specific embodiment, using only two test heads for a complete probe set, one test head is configured for testing chips in one grouping of alternate columns or rows of chips on a certain wafer, and the other is configured for testing chips in the remaining interleaved alternate columns or rows of chips on the same wafer. The probe sets corresponding to the configurations of different wafers are stored in a cassette. A membrane probe test fixture insert is installed in a test fixture for each test head configuration. A wafer containing chips to be tested is positioned adjacent a test fixture, and a pick and place machine is employed to selectively extract a chosen probe test head from the cassette and move it to the fixture to which it is detachably connected, both mechanically and electrically at the same time, to allow the probe test head to contact the chips of one grouping of chips to be tested.

According to another feature of the invention, an individual test head of a probe set is formed of a substrate having elongated mutually spaced ports spatially corresponding to alternate columns or rows of chips on the wafer to be tested, and a flexible transparent membrane having a pattern of electrically conductive traces formed on the membrane. A plurality of contact pads are formed on selected ones of the traces, the contact pads being visually accessible through the substrate elongated ports. Connector pads on the membrane are connected to the traces to facilitate rapid detachable electrical connection to a test fixture.

According to other features of the invention, the test head membrane may have a terminating resistor for terminating a high frequency transmission line or may have a buffer chip to provide high impedance, low capacitance loading. These and other circuit elements may be mounted on the substrate ribs, i.e., the material between and separating the elongated ports. Multiple layers of a test head membrane may be employed to attain complex geometry of probe contact pads and trace patterns.

BRIEF DESCRIPTION OF THE DRAWINGS

In the accompanying drawings:

FIG. 1b is an enlarged pictorial view, partly in cross section of part of the probe test head of FIG. 1a;

FIG. 1c is a cross section view of a peripheral portion of the probe test head of FIG. 1a;

FIG. 2b is a cross section taken on line 2b—2b of FIG. 2a;

DETAILED DESCRIPTION OF AN EXEMPLARY EMBODIMENT

Figure 1A:
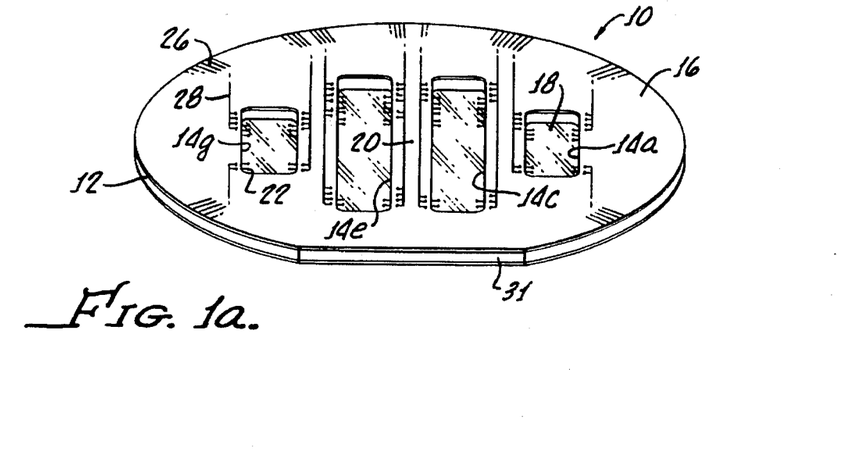
FIG. 1a is a pictorial view of one membrane probe test head of a pair of test heads embodying principles of the present invention.
Figure 1B:
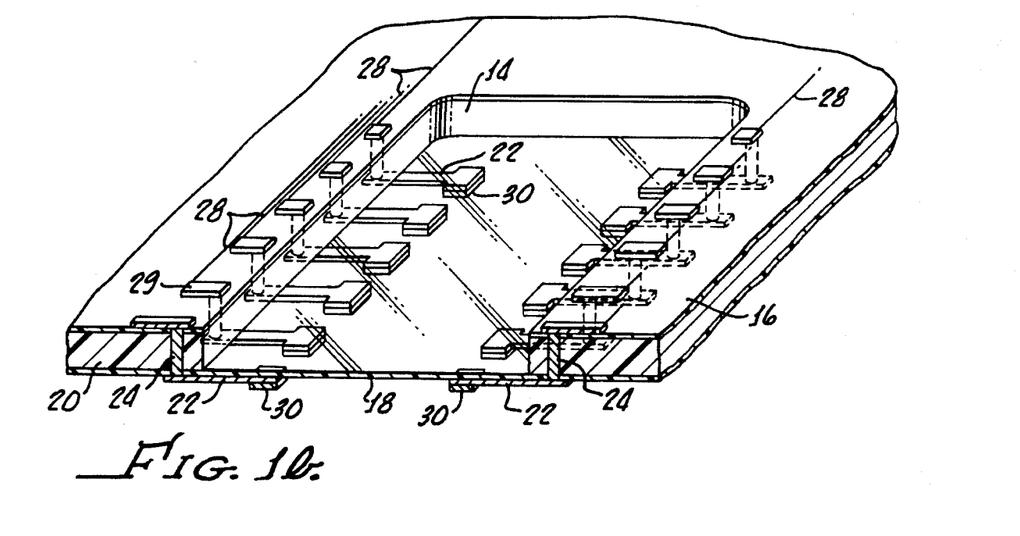
Figure 1C:
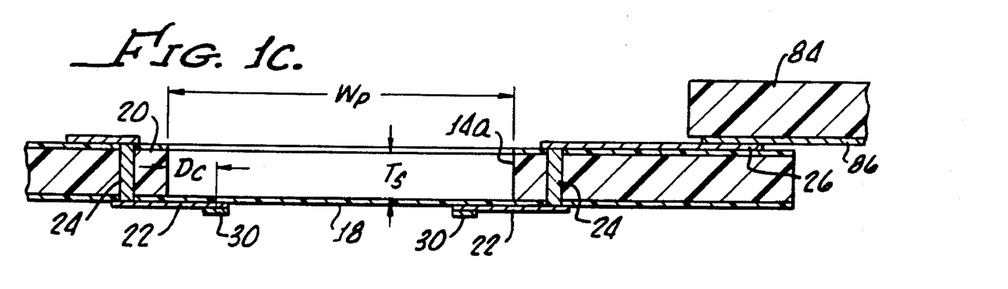

FIGS. 1a through 1c illustrate a membrane probe embodying principles of the present invention. This probe is an improved version of the diaphragm test probe disclosed in the above-identified U.S. Pat. No. 5,148,103. A flexible diaphragm, conductive contact pads and an arrangement for applying pressure to one side of the flexible diaphragm to accomplish self planarizing contact of the probe pads against the pads of a die or chip under test are features of the U.S. Pat. No. 5,148,103 as are a probe arrangement that adapts the probe for use in wafer testing processes using conventional pick and place loading and cassette storage of both membrane probes and test wafers.

Significant improvements of the present invention over the prior art include a multiport configuration of probe test heads that overcomes membrane sag or drape to advantageously permit an entire column or row, or a group of entire columns or rows, either odd or even, of integrated circuit chips on the wafer to be contacted and tested during one massive touchdown of a probe test head. Additionally, the more rigid nature of the probe central region surrounding and separating the probe ports allows mounting of circuit components such as high current leads, decoupling capacitors and isolating resistors within that supportive probe central region.

A typical wafer, of three to eight inches in diameter, for example, is formed with as many as several hundred individual dies, each of which has a width $W_d$ (FIG. 4a) of about 500 mils, and all positioned usually, but not necessarily in an array of columns of dies that are each spaced from all adjacent columns of dies on the wafer. It is desirable to test these dies on the wafer in as short a time as possible. Therefore it is desirable to enable simultaneous testing of all dies on the wafer, or at least of all dies of a group of dies on the wafer.

Figure 4A:
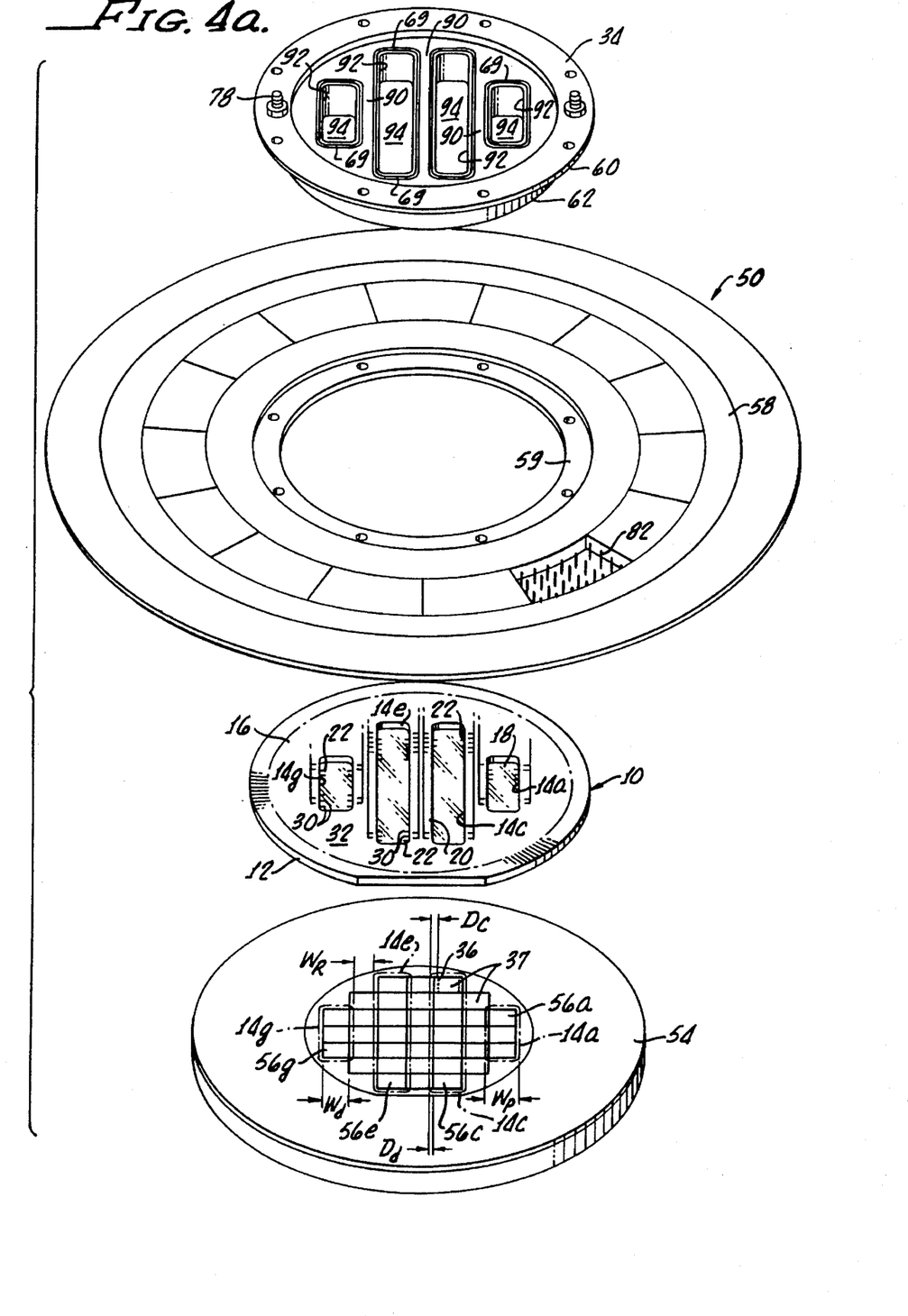
FIG. 4a is a pictorial view with parts exploded of the test fixture and work table of FIG. 3 showing one of two test heads of a probe pair and its insert.
Figure 4B:
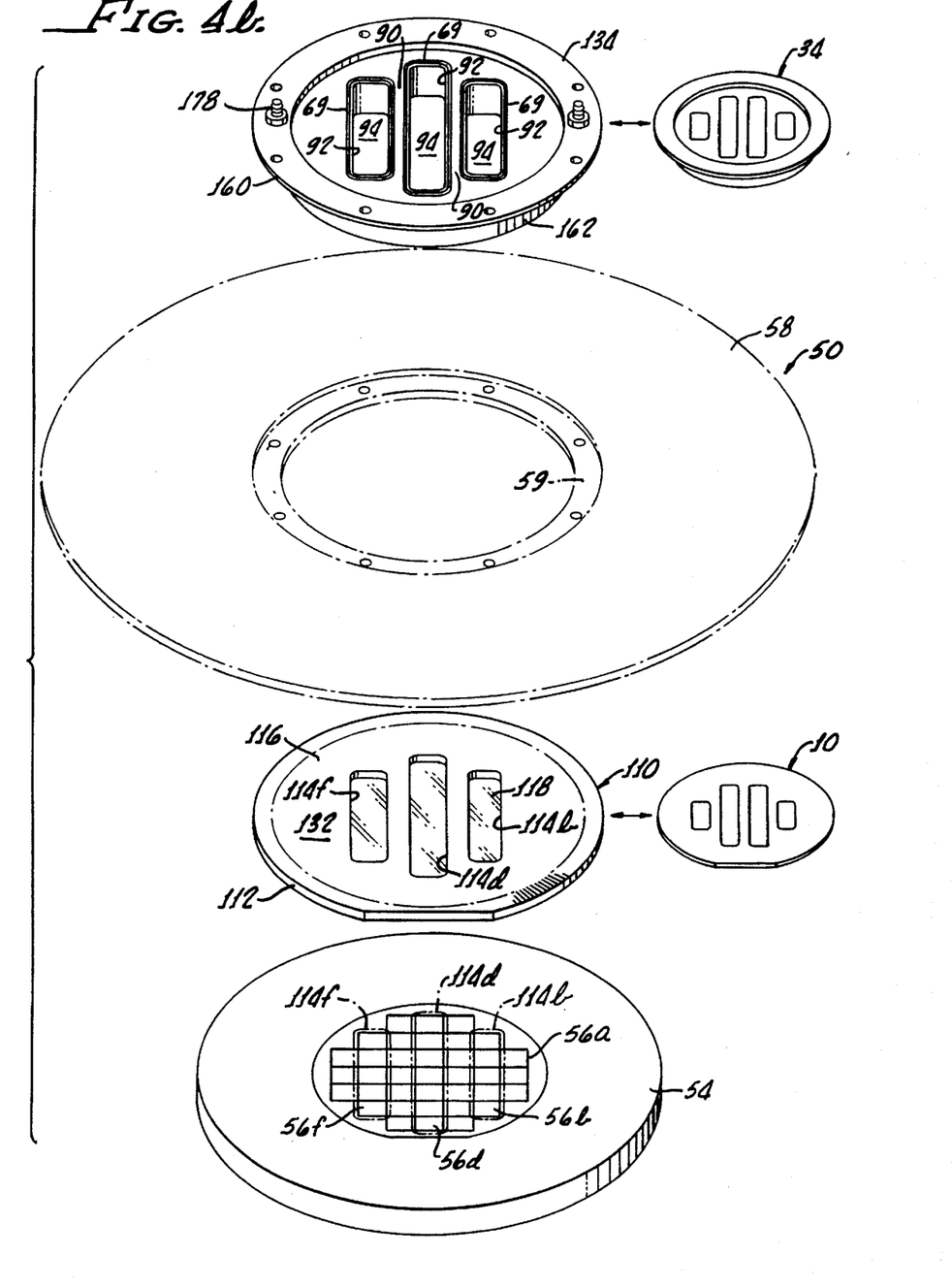
FIG. 4b is a pictorial view with parts exploded of the test fixture and work table of FIG. 3 like FIG. 4a, but showing the other of two test heads of a probe pair and its insert.

An exemplary membrane probe test head configured for testing all dies in only two operations is illustrated in FIGS. 1a through 1c for purposes of explaining the present invention. The dies on a wafer are divided (operationally, but not physically) into two groups for use of a two test head probe set, or probe pair. The first group is composed of alternate columns of dies, such as the odd numbered columns illustrated in FIG. 4a as 56a, 56c, 56e and 56g, for example, and the second group is composed of the remaining dies, namely the even numbered columns (56b, 56d and 56f of FIG. 4b) which are interlaced between the odd numbered columns. A probe pair includes a first test head 10 uniquely configured for simultaneous testing of all dies of the first group of dies, and a second test head 110 uniquely (and differently) configured for simultaneous testing of all dies of the second group of dies. The probe pair 10,110 thus completely tests all chips on a full wafer with only two touchdowns of the probe, one for each test head of the probe pair. Test heads 10 and 110 of a probe pair are shown in FIGS. 4a and 4b respectively.

Each of the probe tests heads 10,110 is formed of an electrically non-conductive rigid or semi-rigid and self supporting substrate 12,112 in the configuration of a generally flat, thin disc having multiple elongated ports 14,114 extending completely through the substrate and clad on both sides with thin layers of a transparent flexible dielectric such as polyimide layers 16,116 and 18,118. Ports on first test head 10 are numbered 14a, 14c, 14e and 14g to better portray the alternate row configuration of the test head. Accordingly, ports on second test head 110 are in like manner numbered 114b, 114d and 114f as shown in FIG. 4b.

For simplicity of explanation, the remainder of the discussion will address only test head 10, it being understood that the discussion applies as well to corresponding features of complementary test head 110, since the two test heads are identical except for the differences (to be described below) in the location and configuration of their elongated ports.

Outer layer 18 extends across each port 14 but inner layer 16 does not, being of a configuration congruent with substrate 12 having apertures coextensive with substrate elongated ports 14 as illustrated in FIG. 1a. Thus each port is closed on one (outer) side of the substrate by a layer, but is open on the other (inner) substrate side to admit air pressure, as will be described below. Those straight portions of substrate 12 immediately adjacent ports 14 are designated rib portions 20 and include those substrate portions separating adjacent ports from one another. A pattern of electrically conductive contact traces 22 is formed on one (outer) side of the substrate, upon polyimide layer 18. The contact traces extend from contact trace end portions disposed in a selected pattern upon the membrane 18 within the boundaries of each substrate port 14. The traces run generally perpendicular to substrate rib portions 20 and extend to a plurality of metallized vias (conduits) 24 that extend through the substrate and polyimide layers on each side, as seen in FIG. 1b. The inner side of the probe test head, which bears the polyimide layer 16, carries on the periphery of the test head a plurality of relatively short, radially extending electrically conductive connector pads 26 (FIGS. 1a and 1c) connected to signal traces 28 extending along rib portions 20. Each of these signal traces may be connected to one or more of the contact traces 22 by means of the appropriately located metallized substrate vias 24. Alternatively, connector pads 26 may be formed directly on the substrate 12, omitting layer 16. The end of each contact trace opposite its substrate via bears an axially projecting contact pad, such as pads 30, such contact pads being positioned in a configuration that will match the pads of a circuit die that is to be tested. Thus the contact pads are positioned on an unsupported area of the membrane within each port. In use of the probe, with the outer layer 18 facing downwardly, the contact pads 30 are the lowest points of the probe, so that only these pads will contact a chip to be tested, particularly after the pads are displaced outwardly by air pressure applied to each port to bend the flexible membrane outwardly.

Substrate 12 is formed preferably of a thin rigid photoceram material having a flat edge section 31 (FIG. 1a) formed on one side thereof to enable handling and orientation by well known pick and place equipment, as will be described below. The entire membrane probe is dimensioned, configured and arranged to be handled by known pick and place equipment which may be substantially identical to equipment arranged to handle the wafers to be tested.

In manufacture of the described membrane probe test head the photoceram substrate 12, in the form of a solid, substantially rigid and self-supporting disc, is provided with a number of preformed holes to be used as the vias 24. Preferably the photoceram disc may have a diameter larger than the diameter of a standard wafer and may be six inches to ten inches in diameter, for example, having a thickness $T_s$ (FIG. 1c) of about 90 to 125 mils. A thinner substrate will provide less support for the membrane segments stretched across each port, while a thicker substrate presents problems in filling of the vias with conductive material as described below. A layer of the membrane 16,18 is applied to each side of the photoceram substrate by employing standard spinning techniques in which a small amount of polyimide is placed on the photoceram surface and the disc spun to centrifugally distribute the polyimide evenly and radially outwardly. Several repetitions of this spinning process will build up the membrane thickness to provide a finished polyimide membrane of about 1 mil in thickness on each side of the photoceram substrate. The polyimide is highly transparent, as described in my above-identified U.S. Pat. No. 5,148,103 to enable visual registration of the membrane probe contact pads 30 with appropriate pads on the wafer die being tested. Although the polyimide film may be applied in various ways, the spinning process is preferred because it yields a film that, although axially flexible within ports 14, is laterally taut across the relatively narrow transverse span of a port 14 so that the film is dimensionally stable in the plane of the film but may be flexed outwardly by gas pressure, as will be described below.

After application of the polyimide film to both sides, the contact traces 22 and contact pads 30 are formed on one side of the substrate, on membrane 18. The connector pads 26 are then formed on the other side and the ports 14 are formed in the photoceram and also in the inner polyimide layer 16 but not in outer layer 18. To perform these steps, after photolithographically applying resist in a suitable pattern to the outer polyimide layer 18, a metal such as a mixture of tungsten with a small amount of titanium, W(Ti), is sputtered over the entire surface including the resist and vias, and the resist (and portions of the sputtered metal) is then lifted to leave a pattern of thin, sputtered traces forming the pattern of contact traces 22 on the polyimide layer 18. The contact traces 22, which may be formed of copper, for example, are then electrolytically plated upon the pattern of sputtered-on metal traces, at the same time metallizing the interior of the vias 24. The vias may be filled with silver glass frit to provide superior conductivity. Then the entire lower surface, except for those areas at the end of traces 22 that are to be covered by contact pads 30, is coated with a dielectric passivation layer (not shown), which may be of a polyimide, to effectively electrically insulate the conductive trace surfaces. Now, using photolithography, masking and applying resist, the contact pads 30 are plated (up to a height of 1 mil above traces 22, for example) on the ends of contact traces 22. If deemed necessary or desirable the contact pads finally may be flash coated with a highly stable conductive material such as a nickel-gold flash coating.

Similarly, photolithography, employing suitable application of resist, development of the resist and removal of the undeveloped resist, is then employed to first sputter a thin metal coating on inner layer 16 in the desired pattern of connector pads 26 which then may be copper plated to provide a plurality of connecting pads (about 1 mil high) that extend in closely spaced relation circumferentially around the periphery of the inner side of the membrane probe, as can be best seen in FIG. 1a. Each of these pads is connected to a signal trace 28 that extends to a metallized via 24 so that at least some peripheral connector pads are electrically connected by way of such vias to associated ones of the contact traces 22. In addition, power and ground traces (not shown) may be formed on the surface of polyimide layer 16, on an adjacent polyimide layer (not shown), or on a layer or layers (not shown) adjacent outer membrane 18. These power and ground traces may then be connected to connector pads 26 in the manner described above. In addition, electrical circuit elements may be mounted on the probe 10 and supported by the substrate 12 rigid surface, such as, for example, thin film resistor 29 (FIG. 1b) for isolating a power or data trace from a shorted chip 37 (FIG. 4a).

After forming the conductive traces on both sides of the membrane probe by suitable masking and application of resist, the several elongated ports 14 are etched through the central region of substrate 12 (and through layer 16), resulting in the final probe configuration illustrated in FIGS. 1a and 1b. The result is a thin, relatively rigid, self-supporting disc having a flat edge 31 for orientation by automatic handling equipment and thin, flexible, taut, transparent port membranes 18 to the outer side of which are affixed the projecting probe contact pads 30 in a selected pattern that matches the pattern of pads on a grouping of alternate columns of dies to be tested. For example, if each die of a column of dies has a set of fifty contact pads and there are fifty dies in a column, the portion of membrane 18 that is stretched across that port that corresponds to the particular column of dies will have fifty sets of membrane contact pads with fifty pads in each set, all configured so that in a single touchdown of the test head to the wafer, each pad of each die of the column will be contacted by a membrane pad.

The other (inner) side of the probe test head has an annular array of connector pads 26, all lying in a single plane on the periphery of the test head, and a flat port-surrounding surface 32 (FIG. 4a) defining the test head area between the connector pads 26 and elongated ports 14 and including the area between the ports. Surface 32, comprising all of the probe substrate surface except for areas taken up by pads 26 and the ports (and their sealing O-rings), is used for vacuum attachment of the probe test head, as will be described below.

Although only four mutually opposed and parallel ports are shown, other numbers and configurations of ports may be used as deemed necessary or desirable. The configuration of the ports and their grouping is specifically chosen to match the configuration of a column of dies and the configuration of a group of alternate columns in the illustrated arrangement. For example, if the aspect ratio of the dies on the wafer is such that the width ($W_d$) of a die is substantially less than its length, the distance between columns (i.e., vertical arrangement of FIG. 4a) is relatively narrower than the distance between rows (i.e., horizontal arrangement) of the same dies. Consequently, an arrangement of ports 14 spaced on alternate columns (FIG. 4a) will result in a rib width ($W_r$) narrower than would result from an arrangement of ports 14 spaced on alternate rows. Accordingly, probe 10 may be configured to space ports 14 on alternate rows rather than alternate columns to provide desirably wider ribs 20 under the described conditions. For simplicity in explanation, reference herein is made generally to columns of dies, but it will be understood that the description applies equally to rows of dies.

Figure 2A:
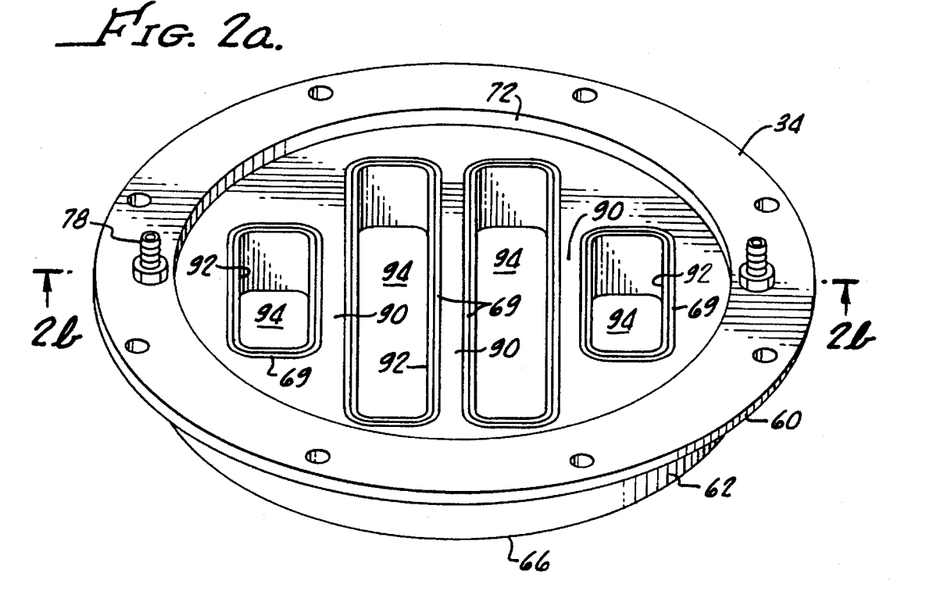
FIG. 2a is a pictorial view of a test fixture insert of the present invention.

The illustrated membrane probe may be used with many different types of testers and test fixtures. It is preferably used with application of a suitable pressure, such as a gas pressure, against the inner surfaces of the flexible transparent membrane 18 within elongated ports 14. However, the probe illustrated is specifically designed for use in a test fixture to which the probe may be readily mechanically and electrically connected and disconnected, either manually or by automatic machines. In the illustrated probe configuration, both electrical and mechanical connection of the probe to a test fixture are accomplished in coordination with the configuration of the inner surface of the probe. This inner surface of the probe test head includes the connector pads 26 that form a substantially circular array around the periphery of the inner side of the test head, and the flat inwardly facing surface 32 (FIG. 4a) of polyimide layer 16 that extends between the connector pads 26 and the boundaries of the elongated ports 14 that extend through the substrate. This flat surface 32 is configured and arranged to enable vacuum attachment of the membrane to a test fixture insert 34 of a test fixture 50, shown in FIGS. 2a, 2b and 3.

Figure 3:
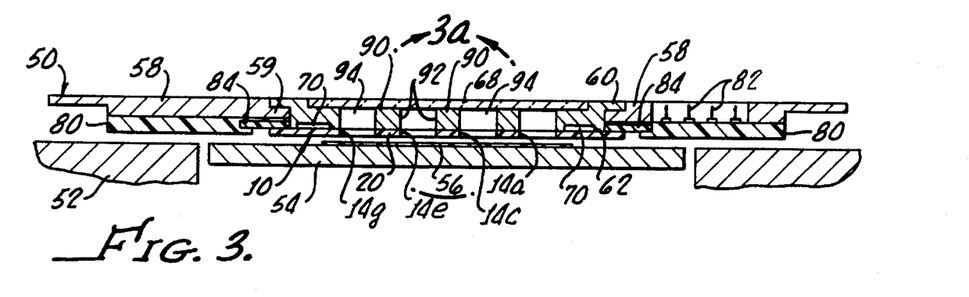
FIG. 3 is a sectional view of a test fixture and work table for testing integrated circuit chips of a wafer.
Figure 3A:
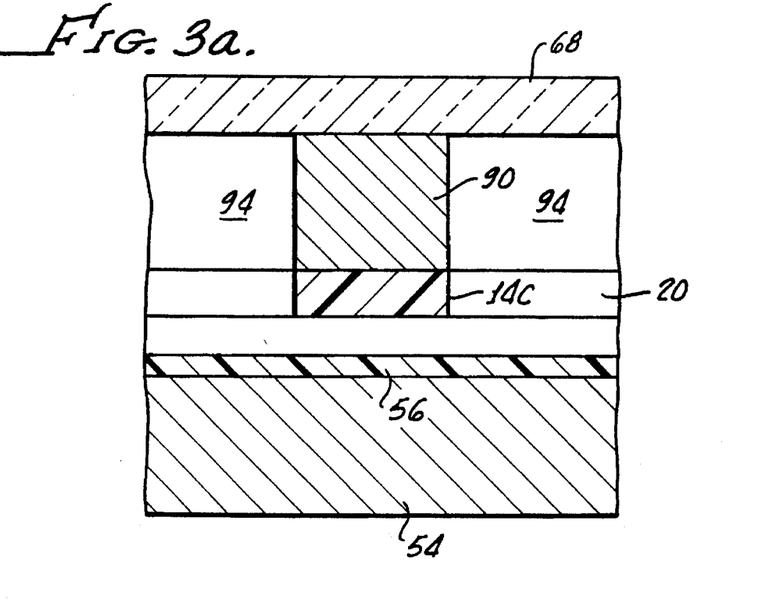
FIG. 3a is an enlarged fragmentary view of an encircled portion of FIG. 3.

Illustrated in FIG. 3 is a test fixture, generally indicated at 50, fixedly mounted to and above a support 52 that carries a movable work table 54 on which is mounted a test wafer 56 bearing dies that are to be tested by a membrane probe test head 10. The latter may be of the configuration illustrated in FIGS. 1a and 1b. The work table is movable in X,Y and Z, that is, in two perpendicular directions horizontally, and in one direction vertically by suitable manually controllable means (not shown).

Figure 2B:
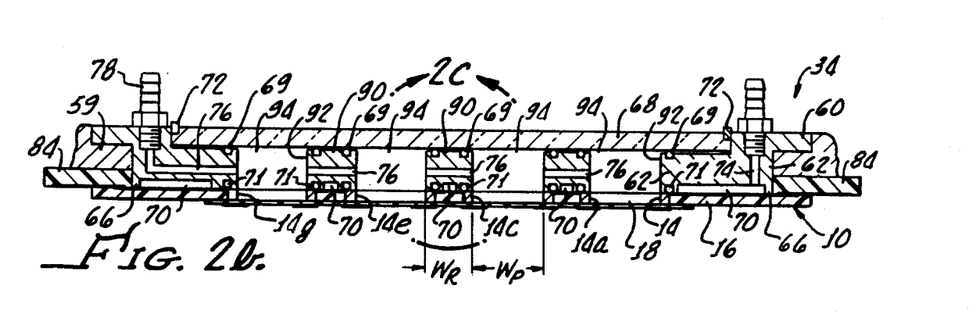
Figure 2C:
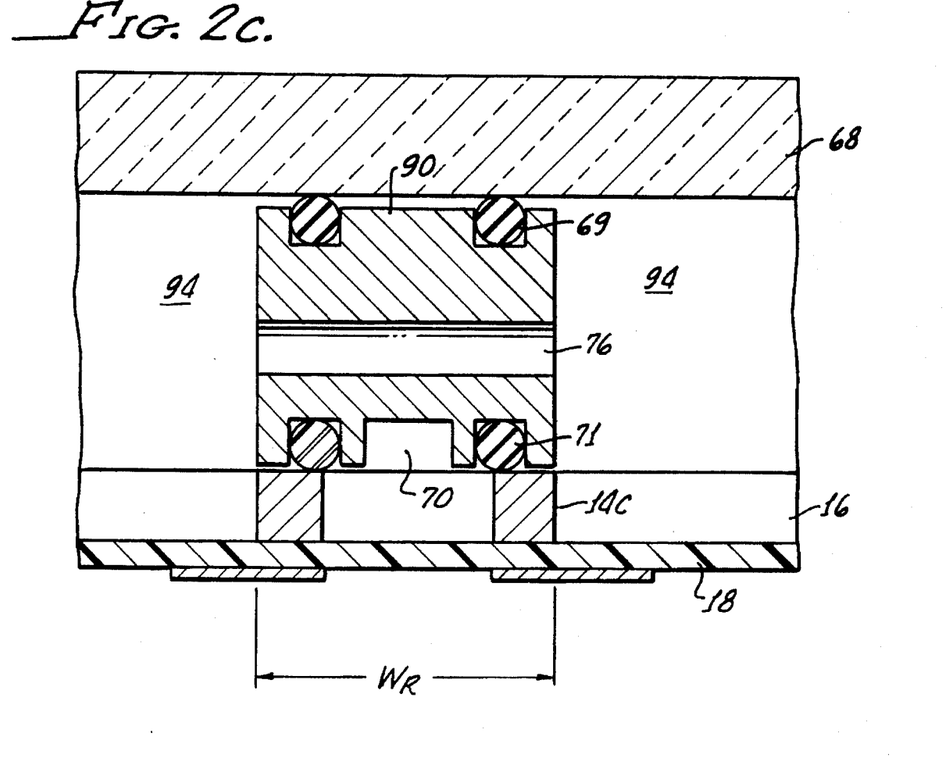
FIG. 2c is an enlarged fragmentary view of an encircled portion of FIG. 2b.

As can be seen in FIGS. 2b and 3, a rigid mounting plate 58 is fixedly carried on support 52 and has a central aperture defined by a radially inwardly directed lip 59 which supports a circumferential radially outwardly extending flange 60 of a test fixture insert 34 including a gas chamber housing 62. Gas chamber 62 is circular in horizontal section and includes vertical partitioning members 90 forming walls 92 of elongated communicating pressure chambers 94 corresponding to and generally slightly larger in horizontal cross section than the elongated ports 14 of test head 10. Pressure chambers 94 are closed and sealed at their upper ends by a clear, transparent glass window 68 held in place by a retainer ring 72. Gas chamber housing 62 has a planar annular lower surface defining an annular peripheral seating rim 66 that defines a recess 70 congruent with the surface portion 32 of probe test head 10, i.e., that portion of the probe surface that lies radially between the connector pads 26 and the boundaries of elongated ports 14 of the test head including the probe surface between the ports.

Recess 70, enclosed by the bottom surface rim 66 of the gas chamber housing 62 and test head surface portion 32 is connected by a conduit 74 to a source of vacuum (not shown) so as to firmly affix the probe test head 10 to the bottom surface of the gas chamber housing 62 in a gas tight sealing relation when vacuum is applied through the conduit. Thus the membrane test head is attached in a readily attachable and detachable fashion to the test fixture.

An angulated gas conduit 76, formed at and extending through one side of the gas chamber housing 62, connects to the interior of all pressure chambers 94. Conduit 76 is adapted to be connected by means of a fitting 78 to a source of pressurized gas, such as air, which will apply a pressure to and within all communicating chambers 94 in the order of two to four pounds per square inch, thereby causing flexible membrane layer 18 to flex outwardly within each elongated port. Pressure chambers 94 all are sealed to window 68 by window O-ring seals 69 positioned between the window and partitioning members 90. The pressure chambers are in fluid communication with one another by accessible portions of conduit 76 extending through input partitions 90 as shown in FIG. 2b. The large area vacuum chamber 70 is isolated from the pressurized communicating chambers 94 in test fixture 34 by vacuum O-ring seals 71 mounted in partitioning members 90 and bearing against peripheral edges of the test head ports. Thus the probe attaching vacuum extends around and between the ports whereas the membrane distending positive pressure is confined to the areas within the ports.

For readily detachable and attachable electrical connection of the test head to the test fixture, a multilevel printed circuit board 80 as shown in FIG. 3 is fixedly secured to the fixture mounting plate 58 as by mechanical fasteners, clamps or adhesive (not shown). Leads on the printed circuit board 80 are connected to an elastomeric electrical connector 84 in the form of an annular metal-on-elastomer ring known as an annular MOE. The MOE comprises a suitable elastomer, such as a silicon sponge, that has a plurality of circumferentially spaced, closely positioned, narrow metal connector elements positioned thereon as shown in my prior U.S. Pat. No. 5,148,103. The connector elements of the MOE and the connector pads 26 of the probe test head are positioned to mate with one another when the membrane probe test head is secured by the vacuum of annular recess 70 to the gas chamber housing 62.

A middle level of printed circuit board 80 is radially set back to provide a recess that receives the MOE 84 as best seen in FIG. 3. MOE 84 includes elongated electrically conductive connector elements 86 (FIG 1c) on its lower surface which contact the connector pads 26 of the membrane probe and also the signal leads of the multi-level printed circuit board. The MOE also includes elongated contact strips on its upper surface which contact ground traces of the printed circuit board, thereby electrically connecting the membrane probe to the test fixture. Suitable electrical connections in the form of vias (not shown) extending through the MOE connect the elongated strips on its upper surface to associated connector pads 26 on the membrane probe test head. The signal leads and ground leads of the circuit board are coupled to testing circuitry by means of circuit connectors 82 (FIG. 3).

Shown in the pictorial view of FIG. 4a are the probe test head 10 and the work table 54. The table temporarily but fixedly supports the wafer 56 which is to be tested. The small rectangular dots indicated at 36 on the wafer 56 represent die pads of the chips or dies 37 that are to be tested. The dies are actually separated from one another on the wafer so that they can be individually severed. The die pads of each die define a pattern that is precisely matched by respective ones of each pattern of contact pads of the test head 10. The number and pattern of test head contact pads on all ports of one test head is the same as the number and pattern of die pads of all dies in alternate columns of dies on the wafer so that all dies can be contacted in two touchdowns of the membrane probe, one for each test head 10,110 in the membrane probe pair. For example, as shown by the dotted lines in FIG. 4a, port 14a covers die column 56a, port 14c covers die column 56c, port 14e covers die column 56e and port 14g covers die column 56g, in the illustrated exemplary configuration. The ports of the second test head 110 of a pair respectively cover each of the die columns not covered by a port of first test head 10.

As noted earlier, a prime purpose of narrowing the span of the membrane within a port is to overcome the membrane sag or drape that is characteristic of the wider span of the prior art. It is desirable, therefore, to keep the width $W_p$ (FIG. 1c) of such a port 14 to a minimum, preferably not much greater than the width of a single die in the column of dies covered by the port. However, because the membrane contact pads must lie on a membrane segment that is between the edges of a port, the port can be no narrower than the width between contact pads of such a die, and in fact must be at least wide enough to allow for sufficient distance between the edge of the port and the die contact pads to permit the membrane to flex downward to the die pads where air pressure is applied via the insert to the test head ports. FIG. 4a illustrates the critical distances just described.

For a typical die width $W_d$, (FIG. 4a) of 500 mils, the membrane distance $D_d$ from one edge of the port (e.g. 14c) to its adjacent die column (e.g., 56c) edge is preferably about 60 mils to provide sufficient downward membrane displacement in the exemplary embodiment. Since the die pads 37 are inset within the die in the order of 5 to 10 mils from the edge of the die, the distance $D_c$ from the edge of the port to the center of the die pad is $D_d$ plus the 5–10 mils die inset distance, or a total $D_c$ of about 65 to 70 mils, which determines and corresponds to the length of contact traces 22 from the port edge to contact pads 30 in FIG. 1c.

As can be seen in FIG. 4a, membrane distance $D_d$ is required on both sides of die column 56c, so that the total width $W_p$ of port 14c, for example, is the width of the die column 56c (500 mils) plus the sum of the membrane distances $D_d$ on either side of the die column 56c (120 mils) or about 620 mils. A typical rib 20, therefore, separating for example ports 14c and 14e, will have a width $W_r$ equal to the width $W_d$ of a die minus the sum of the membrane distances $D_d$ on either side of the rib, i.e., $W_r=W_d-2 D_d=500-120=$ 380 mils for the width of a typical rib 20. These dimensions provide the necessary balance between increased substrate rigidity for optimum membrane sag minimization and component support on the one hand, and the necessary membrane flexibility on the other hand to permit the membrane contact pads 30 to be displaced under pressure so as to mate positively with the die contact pads 37. In general the port width is not greater than one and one-half times the die width and the port length is not less than an integral number of die lengths, so as to minimize drape and still allow simultaneous testing of a number of dies.

Referring again to FIG. 3, the metal-on-elastomer (MOE) fixture connector 84 affords a simple, rapid detachable electrical connection between the test fixture printed circuit board 80 and connector pads on the membrane probe test head 10. The test head is formed with its circular peripheral array of connector pads 26, which mate with the circular array of the connector elements of the MOE. The resilient elasticity of the MOE ensures good electrical contact of all connector pads when the test head is pressed upwardly against the fixture by means of the applied vacuum. Because of the resilient support and mounting of the MOE connector elements, they may readily deflect individually relative to one another when contacted by the associated connector pads 26 of the membrane probe test head to assure good firm, but detachable, electrical connection of the test head to the test fixture and to ensure planarity so that all connector pads will be in good electrical contact.

The described arrangement of fixture and membrane probe readily lend themselves to automatic test operation in a well-known pick and place system. In such an automatic system a wafer cassette storage device stores a plurality of test wafers (bearing dies to be tested) which may be selectively extracted by a conventional type of pick and place machine. A test wafer is extracted from a wafer storage cassette and placed on the work table 54 of the test fixture.

Similarly, a second cassette storage device stores a number of different membrane probe test heads, all of which have the same mechanical size but which differ from one another by different patterns of traces and contact pads. A test fixture insert 34 or 134 corresponding to a selected test head 10 or 110 is manually installed as by suitable mechanical fasteners (not shown) in test fixture 50 as shown in FIG. 3. A second pick and place machine, or the same machine that was employed for emplacement of wafers 56, is arranged to extract a selected membrane probe test head from a probe storage cassette and position it in test fixture insert 34 of the test fixture 50 for connection in the manner illustrated in FIGS. 3 and 4a. After the test probe has been positioned in contact with the elastomeric probe connector (MOE), vacuum is applied via conduit 74 to mechanically fix the probe test head to the test fixture, and the test wafer is moved upwardly to or toward a very light contact with the test head contact pads. Now the operator visually observes the contact pads, which are readily visible through the probe ports 14 and the transparent membrane 18 upon which the contact pads are mounted. While the operator observes relative registration of the probe contact pads 30 with the die pads 36, the table 54 and wafer 56 thereon are moved to precisely align the probe contact pads with the die pads of each chip 37. The table then may be slightly raised an additional amount to a point where the contact pads are barely or almost contacting the die pads, and gas pressure then is applied to the test fixture communicating gas chambers 94. The applied gas pressure on the thin flexible polyimide film stretched across each elongated port 14 forces the probe contact pads into contact with the wafer die pads, providing a high contact pressure and excellent registration consistency because of the taut span of the membrane in the transverse direction, i.e., across the narrow dimension of the port, while the flexibility of the membrane that carries the contact pads 30 provides a self planarization of the contact pads to ensure good firm electrical contact between each probe contact pad and its associated wafer die pad.

A typical wafer may contain dozens or hundreds dies and therefore dozens or hundreds of groups of die pads. Each probe membrane test head contains sufficient groups of contact pads so that one group of alternate columns of chips on the wafer under test may be tested at a given time. After completing a test on one group of dies, (e.g., all dies in one group of alternate columns of dies), the gas pressure is released from the pressure chambers 94 and the second test head of a probe pair is similarly installed in the test fixture along with its corresponding test fixture insert which is uniquely configured with a plurality of pressure chambers 94 in a pattern conforming to the pattern of ports in the second test head. Then the test of the remaining die groups (alternate die columns) is accomplished after repressurization of the test fixture insert communicating gas chambers.

The test procedure itself, after the appropriate contact is made between the test fixture and the wafer to be tested, can be carried out in an exceedingly short time because all dies of a plurality of columns of dies (e.g., substantially half of the total number of dies on the wafer) can be tested either simultaneously or one column or one die at a time, using only one touchdown of a single test head. In contrast, the time required to properly position the test probe and wafer under test is considerably longer than the time required for the actual testing. Therefore, the ability to test many dies with only a single probe positioning effort is a major time saver.

It will be readily understood that two test fixtures may be employed for rapid parallel operation, wherein test fixture insert 34 (FIG. 4a) for odd column testing is installed in one such test fixture, while a test fixture insert 134 (FIG. 4b) for even column testing is installed in the other such test fixture. Accordingly, the wafer under test is positioned in the first test fixture and tested as described above, then is moved by its pick and place machine to the second test fixture to complete the testing of the remaining columns of chips. In this way, only one test head of each probe pair need be stored in a designated cassette and handled by one pick and place machine, greatly decreasing the positioning and registration time and significantly facilitating visual registration so as to greatly increase the rate of testing.

Additionally, other methods of firmly securing the membrane probe test heads to the test fixture are contemplated. For example, wafer and probe connection means are feasible which retain the pressurization aspects of the present invention for deflection of the membrane, but feature mechanical fasteners rather than vacuum attachment of the probe.

It will be readily appreciated that the test probe and fixture and the method of testing described herein have a great many advantages. These advantages include the capability of testing a full wafer having 10,000 to 30,000 contacts, including burn-in testing, in just two massive touchdowns of a membrane probe pair, a capability that was not available heretofore because of the inability to simultaneously connect to widely separated dies and die pads on the test wafer. The ability to successfully contact such die pads is now achieved through the novel employment of a multiplicity of elongated ports on a test head which overcomes the membrane sag problem while retaining the soft pad contact which causes less damage to die pads than needle or blade contacts of prior probe cards. Such utilizing of multiple ports provides the additional advantage of permitting traces and circuit elements to be placed on the rib portions of the substrate that surround the ports, in positions very close to the probe test contact pads.

Importantly, each port has at least one dimension that is not greater than about one and one half times the width of a single die on the wafer. With this very small transverse dimension and a longitudinal dimension that is many times greater than the dimension of a single die (e.g., great enough to cover one full column of dies, or a full row of dies as noted earlier), the test head enables the testing of many dies with but one single touchdown, but still avoids the problem of membrane drape, or sag, which would otherwise cause a large unsupported area of membrane to sag and consequently make contact with other wafer parts and dies other than the dies under test. Moreover, with a large unsupported membrane area bearing several sets of contacts for plural dies on a wafer, the outward pressurization of the membrane would effect varying and uncontrolled relative lateral displacement of different membrane areas, thus preventing precision alignment.

The temperature coefficient of expansion of the substrate can be matched to the temperature coefficient of expansion of a wafer under test so that testing over an extended range of temperatures is possible. Without such matching of temperature coefficients of expansion, a different expansion of the test probe substrate and the wafer would cause serious misalignment or require use of different probes at different temperatures.

Manufacture of the probes described herein is much faster, more efficient, and less expensive since once the appropriate dies and masks for the photolithographic techniques employed have been manufactured it is relatively simple to manufacture a large number of membrane probes. This is to be distinguished from those probes employing needles and blades which must be individually adjusted on each probe. More importantly, the multiport feature of the present invention minimizes excessive drape or sag of the membrane, and the soft contact between the contact pads of the probe and the die pads causes considerably decreased wear on the probe contacts which require only routine cleaning and need not be frequently adjusted and readjusted.

With the described membrane probe, alignment accuracy of 1 to 2 microns is possible with a high accuracy probe station that enables precision X,Y motion of the wafer under test. Having such high accuracy alignment, it is feasible to make and employ probe pads of less than 1 mil in diameter.

What is claimed is:

1. A probe for simultaneously testing a grouping of integrated circuit chips formed adjacent one another in said grouping on a semiconductor wafer, each chip having a longitudinal dimension and a transverse dimension, said probe comprising:

a substantially rigid substrate having at least one elongated port formed therein, said port having a width not greater than one and one half times said transverse dimension;

a flexible transparent membrane carried by said substrate, at least a segment of said membrane extending across said elongated port;

a plurality of electrically conductive traces formed on said membrane and a plurality of contact pads formed on selected ones of said traces, said contact pads disposed within said membrane segment.

2. The probe of claim 1 wherein said port has a length not less than an integer multiple greater than one (1) of said longitudinal dimension.

3. The probe of claim 1 wherein said grouping of chips includes at least two alternate columns of said chips transversely spaced by an alternate column distance and wherein said substrate further includes said one elongated port and a second elongated port mutually spaced from one another and corresponding to said alternate columns of chips, said second port also having a segment of said flexible membrane extending thereacross, said one elongated port and said second elongate ports of said substrate being separated by a rib region of said substrate having at least one rib, said at least one rib having a width less than said alternate column distance, said probe further comprising:

a second plurality of electrically conductive traces formed on said membrane segment of said second port; and a second plurality of contacts formed on said second plurality of traces.

4. The probe of claim 3 further comprising at least one electrical circuit element disposed along at least one of said substrate ribs.

5. The probe of claim 1 wherein said grouping of chips includes at least two alternate rows of said chips transversely spaced by an alternate row distance and wherein said substrate further includes first and second elongated ports mutually spaced and corresponding to said alternate rows of chips, said first and second ports each having a respective segment of said flexible membrane extending thereacross, said first and second ports of said substrate being separated by a rib region of said substrate having at least one rib, said at least one rib having a width less than said alternate row distance, said probe further comprising:

a second plurality of electrically conductive traces formed on said membrane segment of said second port; and a second plurality of contacts formed on said second plurality of traces.

6. A probe for simultaneous testing of all chips of at least two alternate columns of integrated circuit chips formed on a semiconductor wafer, said probe comprising:

a substantially rigid substrate having a plurality of elongated mutually spaced ports formed therethrough, said ports being separated by a rib region of said substrate having at least one rib;

a flexible transparent membrane carried by said substrate, a plurality of contact pads on said membrane, said contact pads disposed within segments of said membrane coextensive with each of said elongated ports;

a plurality of electrical circuit traces formed on said membrane and electrically connected to said contact pads, and means for detachably connecting said probe to a test fixture.

7. The probe of claim 6 wherein said alternate columns of chips are separated by an alternate column distance, and wherein each said rib has a width less than that of said alternate column distance.

8. Apparatus for testing integrated circuit chips on a semiconductor wafer having predetermined arrangements of said chips divided into at least two chip groupings, said apparatus comprising;

a test fixture having test circuitry connection terminals;

a membrane test probe set having at least two probe test heads, each test head having a plurality of ports and a membrane segment stretched across each said port and supporting a plurality of test pads on each said membrane segment, the ports of each test head being configured to test a different one of said groupings of said chips; and a test fixture insert set having two insert set members respectively corresponding to each said probe test head, said insert set members being interchangeably mounted to said test fixture, each said insert set member being configured to provide a plurality of gas pressure chambers respectively corresponding to the individual ports of one of said probe test heads.

9. The apparatus of claim 8 wherein each of said wafers is divided into a first and second grouping of said chips and each of said test probe sets comprises a test probe pair.

10. Apparatus for simultaneous testing of alternate columns of integrated circuit chips, each chip having a longitudinal and a transverse dimension, said columns formed on a semiconductor wafer, said apparatus comprising:

a test fixture having test circuitry connecting terminals, an elastomeric member fixed to said test fixture and having a plurality of electrical contact elements thereon, means for electrically connecting said contact elements to said test circuitry connecting terminals, and a probe test head comprising:
 a flexible transparent membrane,
 a plurality of contact pads on said membrane,
 a plurality of electrical conductors on said membrane and electrically connected to said contact pads,
 a substantially rigid substrate having a plurality of mutually spaced elongated ports formed therein, said substrate carrying and supporting said membrane, said contact pads being disposed within respective segments of said membrane coextensive with each of said elongated ports; and
 means for detachably connecting said test head to said test fixture, including test head connector pads arranged to contact said connector elements of said elastomeric member.

11. The apparatus of claim 10 wherein said means for detachably connecting said test head comprises a test fixture insert fixed to said test fixture and including a vacuum chamber and means for applying a vacuum to a port-surrounding surface portion of said substrate to pull said substrate toward said elastomeric member.

12. The apparatus of claim 11 wherein said test fixture insert further comprises a gas chamber in fluid communication with each of said elongated ports and isolated from said vacuum chamber, and means for introducing pressurized gas into said gas chamber.

13. The apparatus of claim 10 wherein each of said elongated ports has a width not greater than one and one half times said transverse dimension of one of said chips and a length greater than the total size of a plurality of said chips.

14. Apparatus for simultaneous testing of plural alternate columns of integrated circuit chips formed on a semiconductor wafer, said apparatus comprising:

a test fixture having test circuitry connecting terminals, an elastomeric member fixed to said test fixture and having a plurality of connector elements thereon, means for electrically connecting said connector elements to said test circuitry connecting terminals, a probe pair having two test heads, each test head including:
 a test head body including a substantially rigid substrate having plural mutually spaced elongated ports formed therein and carrying a flexible transparent membrane having segments extending across each said port;

probe contact elements mounted on said membrane segments and probe connector pads electrically connected to said probe contact elements, and cooperating means on said test fixture and probe test head for detachably mechanically interconnecting said test head to said test fixture in a test head operational position, said probe connector pads in said operational position of said test head being in electrical contact with said connector elements of said elastomeric member.

15. The apparatus of claim 14 wherein said cooperating means comprises means for urging said test head toward and against said elastomeric member.

16. The apparatus of claim 14 wherein said cooperating means for detachably mechanically interconnecting said test head comprises means for applying a vacuum to said test head to pull said test head toward said elastomeric member.

17. The apparatus of claim 14 including a test fixture insert fixed to said housing member and having a gas chamber in fluid communication with said test head elongated ports, and means for introducing pressurized gas into said chamber.

18. The apparatus of claim 14 wherein said alternate columns of integrated circuit chips each has a column width and a column length and said columns are spaced apart by an alternate column distance, and wherein each said elongated port has a width and length corresponding to and greater than the width and length of an individual one of said alternate columns and wherein said ports are mutually spaced from one another by a distance less than said alternate column distance.

19. Apparatus for simultaneously testing a plurality of integrated circuit chips in a grouping of such chips formed adjacent one another on a semiconductor wafer, each chip having a longitudinal dimension and a transverse dimension, said apparatus comprising:

a substantially rigid test probe substrate having at least one port formed therein, said port having a first dimension no greater than one and one half times said transverse dimension and a second dimension not less than the total longitudinal dimension of a plurality of adjacent ones of said chips;

a membrane secured to said substrate and having an unsupported segment thereof extending across said port and having an unsupported membrane dimension equal to said port first dimension, said membrane segment having probe contact pads formed thereon; and means for relatively moving said probe substrate and membrane with respect to said wafer to cause said probe contact pads to contact said grouping of chips.

20. The apparatus of claim 19 wherein said grouping of chips comprises a column of mutually adjacent and mutually spaced chips having a column length, said port second dimension being not less than said column length, said chips each having a pattern of chip contact pads, said probe contact pads being formed in a plurality of sets of probe contact pads with the pads of each set conforming to the pattern of pads of respective ones of said chips, there being one set of probe contact pads for each of the chips in said column, whereby each set of probe contacts is on a membrane segment having an unsupported membrane segment width equal to said port first dimension.

* * * * *